United States Patent [19]

Tatsumi et al.

[11] Patent Number: 5,368,686
[45] Date of Patent: Nov. 29, 1994

[54] DRY ETCHING METHOD FOR W POLYCIDE USING SULFUR DEPOSITION

[75] Inventors: Tetsuya Tatsumi; Tetsuji Nagayama, both of Kanagawa, Japan

[73] Assignee: Sony Corporation, Tokyo, Japan

[21] Appl. No.: 899,181

[22] Filed: Jun. 16, 1992

[30] Foreign Application Priority Data

Jun. 18, 1991 [JP] Japan ................................. 3-171882
Jun. 24, 1991 [JP] Japan ................................. 3-177743
Feb. 21, 1992 [JP] Japan ................................. 4-072514

[51] Int. Cl.$^5$ .......................................... H01L 21/00
[52] U.S. Cl. ................................. 156/656; 156/662; 156/643; 156/646; 156/657; 156/653
[58] Field of Search ............... 156/643, 646, 662, 655, 156/656, 657, 653, 651

[56] References Cited

U.S. PATENT DOCUMENTS 4,943,344  7/1990  Tachi et al. ..................... 156/643
4,986,877  1/1991  Tachi et al. ..................... 156/643
5,118,387  6/1992  Kadomura ....................... 156/657

FOREIGN PATENT DOCUMENTS 58-204537  11/1983  Japan .
63-163      1/1988  Japan .
01166539    6/1989  Japan .
4-96224     3/1992  Japan .

OTHER PUBLICATIONS

Tatsumi et al, "Anisotropic Etching of Poly-Si Using Sulfur Deposition", *Proceedings of the 4th Micro Process Conference*, 1991, pp. 32–33.
*Extended Abstract of the 35th Spring Meeting of the Japanese Society of Applied Physics and Related Societies*, 1988, p. 495, Subject 28a-G-2.
"D.C. Plasma Etching of Silicon by Sulfur Hexafluoride. Mass Spectrometic Study of the Discharge Products"; Wagner et al; 1981; pp. 201–215–Plasma Chemistry and Plasma Processing; vol. 1, No. 2.

*Primary Examiner*—R. Bruce Breneman
*Assistant Examiner*—George Goudreau
*Attorney, Agent, or Firm*—Hill, Steadman & Simpson

[57] ABSTRACT

A dry etching method for anisotropically etching a polycide film without using chlorofluorocarbon (CFC). For instance, in a W polycide gate electrode forming process, a W polycide film is etched by using sulfur fluorides, like $S_2F_2$, with a high S/F ratio (i.e. the ratio of the number of sulfur atoms to that of fluorine atoms). In a first step, at least the upper $WSi_x$ layer of the W polycide film is etched with the wafer kept at temperatures between $-20°$ C. and room temperature or with non-depositional fluorine based compounds like $SF_6$ added to etching gas, thus decreasing the S/F ratio of the etching system. This first step promotes elimination of $WF_x$ and reduces the quantity of free sulfur. Therefore, $WF_x$ is inhibited from reacting with sulfur to form $WS_x$ for deposition in excessive quantities on the sidewalls of the $WSi_x$ pattern, thus preventing occurrence of critical dimension losses between the resist mask and the W polycide gate electrode. In a second step, the lower polysilicon layer of the W polycide film is etched with the wafer cooled to lower temperatures or with $H_2S$, etc. added to etching gas, thus increasing the S/F ratio of the etching system. This second step promotes deposition of sulfur on the sidewalls of the polycide pattern and improves anisotropy.

15 Claims, 2 Drawing Sheets

DRY ETCHING METHOD FOR W POLYCIDE USING SULFUR DEPOSITION

BACKGROUND OF THE INVENTION

1. Field of the Invention

The present invention relates to a dry etching method employed in such applications as production of semiconductor devices. More particularly, it relates to a dry etching method whereby a polycide film can be anisotropically etched under effective control without using chlorofluorocarbon (CFC) gas.

2. Description of the Related Art

A polycide film, on which a silicon based material layer and a refractory metal silicide layer composed of tungsten silicide ($WSi_x$), etc. are fabricated in this order, shows a nearly one-digit decrease in resistance over a single-layer polysilicon film of the same sectional area and has been used widely as LSI gate electrode material. Commonly, the silicon based material layer is an impurity-doped polysilicon layer.

However, the polycide film has created new difficulties in a dry etching process wherein both the two dissimilar material layers thereof must be anisotropically etched. Namely, patterns formed of the polycide film are likely to have such etching defects as undercut and narrowing partly because the lower polysilicon layer is etched at a higher rate than the upper refractory metal silicide layer due to the difference in the vapor pressure of a halogen compound resulting from an etching reaction and partly because a reaction layer is formed on the interface between the two layers. Such etching defects are unallowable in the production of submicron devices because the defects form an off-set region, which will not be doped with impurities when ions are implanted to form source and drain regions, or the defects will reduce the dimensional accuracy of a sidewall for forming an LDD structure. To overcome these difficulties, therefore, extensive researches have been conducted to develop a method of anisotropically etching of polycide films.

Conventionally, CFC gas, typically CFC 113 ($C_2Cl_3F_3$), has been widely used as an etching gas for polycide films. CFC gas, which has fluorine and chlorine atoms in each molecule thereof, will emit such radicals as $F^*$ and $Cl^*$ and such ions as $CF_x^+$, $CCl_x^+$, to $Cl_x^+$ to assist an etching reaction and deposit a carbonaceous polymer on the sidewalls of patterns to provide sidewall protection effects, and thus to achieve high etchrate and anisotropy.

However, CFC gas is commonly known to contribute to the destruction of the earth's ozone layer. Therefore, there is a pressing need to find some appropriate alternative substance for the CFC gas, and the efficient applications of this substance in dry etching.

One of the promising CFC-free etching methods is low-temperature etching. This etching method is designed to keep a target substrate (wafer) at temperatures below 0° C. and thereby keep a longitudinal etchrate at a practical level with the assistance of ions while freezing or inhibiting a radical reaction on the sidewalls of the patterns and preventing such etching defects as the undercut. A typical Example of this method is publicized, for instance, in the Extended Abstract of the 35th Spring Meeting of the Japan Society of Applied Physics and Related Societies, 1988, p. 495, 28a-G-2. In this instance, a silicon trench and an $n^+$ type polysilicon layer are etched by using $SF_6$ gas with a wafer cooled to −130° C.

However, this etching method attempts to achieve high anisotropy only by freezing or inhibiting a radical reaction on the sidewalls of the patterns and involves cooling the wafer to such a degree that the method requires liquid nitrogen. Hence, hardware related problems, like decreased reliability of a vacuum sealant, as well as considerable reduction in economy and throughput, makes it difficult to put this method to practical use in the near future.

A more practical etching method might be to combine radical reaction inhibition with sidewall protection at low temperature to perform etching in a temperature zone close to room temperature.

The present inventors have proposed a great number of sidewall protection methods using sulfur (S) deposition. Sulfur will be deposited from the etching gas when the gas is composed mainly of sulfur halides with a relatively high S/X ratio (i.e. the ratio of the number of sulfur atoms to that of halogen (X) atoms in one molecule).

For instance, the present inventors have proposed $S_2F_2$ as one of these sulfur halides in the proceeding on tile 4th MicroProcess Conference (1991), p. 32. Unlike the more well-known sulfur fluoride $SF_6$, $S_2F_2$ will form sulfur in a plasma when dissociated by electric discharges. When a substrate is cooled to temperatures below room temperature, the sulfur thus formed will deposit on the surface thereof, providing sidewall protection effects. When the substrate is heated after completion of the etching, the sulfur deposits will sublime immediately, avoiding the danger of inducing particle pollution.

Further, the present inventors have also proposed polysilicon gate electrode forming process wherein a silicon based compound layer is etched by an etching gas containing such sulfur halides as $S_2F_2$, $S_2Cl_2$, and $S_2Br_2$ and such halogen consuming compounds as $H_2$, $H_2S$, and silane based compounds. $F^*$ will etch silicon based compounds spontaneously even in the absence of ions. This can be accounted for by the fact that Si—Si bond has a small bond energy of 54 kcal/mole compared with 132 kcal/mole for an Si—F bond and that fluorine, having a small atomic diameter, easily enters the crystal lattice of the single-crystal silicon. To reduce the action of $F^*$, therefore, fluorine radical consuming compounds capable of emitting $H^*$, $Si^*$, and other $F^*$-capturing radicals are added to the above-mentioned sulfur halides in the etching gas to increase the apparent S/X ratio of the etching system and promote sulfur deposition. In this etching process, the present inventors have succeeded in forming a polysilicon gate electrode into a highly anisotropic shape on a wafer cooled to −70° C.

Thus, the present inventors have discovered that this etching method using sulfur halides like $S_2F_2$ can form a polysilicon gate electrode into an anisotropic shape in much more practical temperature zones than conventional low-temperature etching. Therefore, it can be expected to apply those sulfur halides to a polycide gate electrode forming process. The most popular polycide film is a tungsten polycide film (hereinafter referred to as "W polycide film") whose upper refractory metal silicide layer is formed of tungsten silicide ($WSi_x$). On the other hand, the most practical sulfur halide is sulfur fluoride, considering the vapor pressure of a refractory metal halide resulting from an etching reaction.

The present inventors have also discovered, however, that this process is likely to cause critical dimensional losses between a resist mask and a polycide gate electrode. This problem is described by referring to FIGS. 1a to 1d.

Referring first to FIG. 1a, a silicon substrate 1 is coated on the surface thereof with a gate oxide film 2. The gate oxide film 2 is provided on the surface thereof with a polysilicon layer 3 doped with impurities and a $WSi_x$ layer 4, which are fabricated in this order to constitute a W polycide film 5. Further, the W polycide film 5 is provided on the surface thereof with a resist mask 6 patterned into a predetermined shape.

Referring next to FIG. 1b, when the W polycide film 5 is etched by using $S_2F_2$ with the wafer thus formed cooled to about $-70°$ C., a $WSi_x$ pattern 4a will be tapered immediately upon etching of the $WSi_x$ layer 4.

The $WSi_x$ pattern 4a is tapered as follows. When dissociated by electric discharges, $S_2F_2$ will emit a plasma F* which will etch the W polycide film 5 with the assistance of such ions as $SF_x^+$ and $S^+$. Consequently, the $WSi_x$ layer 4 will be removed through volatilization in the form of $WF_x$, $SiF_x$, etc. However, part of the $WF_x$ will remain on the sidewalls of the $WSi_x$ pattern 4a on extra low- and middle-low-temperature zones with a low vapor pressure. Meanwhile, $S_2F_2$ will also emit free sulfur in a plasma when dissociated by electric discharges. When a film composed of a single polysilicon layer is etched, such free sulfur will deposit on the sidewalls of the resulting pattern, providing sidewall protection effects. When the $WSi_x$ layer 4 is etched, however, part of the free sulfur will react with $WF_x$ to form tungsten sulfide ($WS_x$: $x=2$ or 3) with a low vapor pressure. Consequently, sidewall protection films 7 each composed of a mixture of $WF_x$, $WS_x$, S, etc. will deposit in excessive quantities on the sidewalls of the $WSi_x$ pattern 4a, and will gradually make the width thereof larger than that of the resist mask 6.

Referring then to FIG. 1c, when the polysilicon layer 3 is etched following the $WSi_x$ layer 4 by using $S_2F_2$, a polysilicon pattern 3a will be formed in such a manner as to have nearly vertical walls while sidewall protection films 8 each composed mainly of sulfur will be deposit on the sidewalls of the polysilicon pattern 3a. The width of the polysilicon pattern 3a, however, is made larger than that of the resist mask 6, because it directly reflects the lowermost width of the $WSi_x$ pattern 4a.

Referring finally to FIG. 1d, when the resist mask 6 is removed through $O_2$ plasma ashing, a W polycide gate electrode 5a will be formed in such a manner as to have a deformed sectional shape. At this time, the sidewall protection films 8 each composed mainly of sulfur will be removed from the wafer through ashing in the form of $SO_x$ or through sublimation under the influence of plasma radiation heat. On the other hand, the sidewall protection films 7 each containing $WS_x$ will not be removed but remain on the wafer. $WS_x$ (particularly when $x=2$) is known to be a very stable, non-water-soluble compound with the resistance to various strong acids. $WS_x$ can be decomposed only by heating it above $1100°$ C. under a vacuum or to $800°$ C. in an $H_2$ atmosphere. However, such heating is almost impossible in the production of semiconductor devices.

Nevertheless, it is preferable to remove the sidewall protection films 7, which, when left on the wafer, may not only hinder formation of an inter-layer insulation film but also cause particle pollution. To this end, it is necessary to set up etching conditions for inhibiting formation of $WS_x$. The same also holds true of etching a silicide layer containing other refractory metals than W.

OBJECT AND SUMMARY OF THE INVENTION

It is therefore an object of the present invention to provide a dry etching method whereby a polycide film can be anisotropically etched without using CFC gas while inhibiting formation in excessive quantities of such refractory metal sulfides as $WS_x$.

Considering $WS_x$ to be typical of refractory metal sulfides, the present inventors have assumed that they are formed through two reactions: (1) a reaction between S and an etching reaction product $WF_x$, and (2) a reaction between S in a plasma and W emitted through sputtering of a $WSi_x$ layer. Based on this assumption, the present inventors have taken two basic measures for inhibiting formation of $WS_x$ in etching at least the $WSi_x$ layer: (a) increasing the vapor pressure of $WF_x$ to promote elimination thereof from the sidewalls of patterns and inhibiting formation of $WS_x$ on the surface of a wafer, and (b) decreasing the S/F ratio (i.e. the ratio of the number of sulfur atoms to that of fluorine atoms) of the etching system to inhibit the formation of sulfur.

According to the present invention, a target substrate is kept at temperatures between $-20°$ C. and room temperature in etching at least a refractory metal silicide layer in line with the first basic measure (a). The following description assumes the $WSi_x$ layer as a typical refractory metal silicide layer.

When F* etches the $WSi_x$ layer, $WF_x$ will be formed as an etching reaction product to attach easily to the sidewalls of patterns at middle-low-temperatures around $-70°$ C., etc. and will combine with sulfur supplied from a plasma to form $WS_x$ for deposition on the sidewalls of patterns, etc. The present inventors have discovered experimentally that a polycide film will be anisotropically etched when a target wafer is kept at temperatures between from $-20°$ C. and room temperature in etching at least the $WSi_x$ layer. By keeping the wafer in this temperature range, therefore, the vapor pressure of $WF_x$ on the wafer can be increased to promote elimination thereof from the sidewalls of patterns and inhibit the formation of $WS_x$ on the surface of the wafer.

Meanwhile sulfur, which is, the main constituent of the other sidewall protection film, will deposit on the sidewalls of the patterns when the wafer is kept at temperatures below room temperature. According to the present invention, therefore, virtually the sulfur alone will serve to protect the sidewalls of a $WSi_x$ pattern, thus preventing tapering thereof due to excessive quantities of miscellaneous deposits on the sidewalls thereof. The sulfur deposits thus formed will cause no particle pollution because they will decompose through $O_2$ plasma ashing for removal together with the resist mask after completion of the etching or sublime for removal from the wafer when the wafer is heated to temperatures above $90°$ C.

Further, according to the present invention, a non-depositional fluorine based compound is added to the etching gas in etching at least a refractory metal silicide layer in line with the basic measure (b). Namely, etching conditions are set in such a manner that F* may be formed in sufficient quantities to maintain the minimum quantities of sulfur necessary to provide sidewall protection effects, thus inhibiting formation of WS$_x$ attaching to the sidewalls of the WSi$_x$ pattern and preventing occurrence of critical dimensional losses or pollution of the wafer.

The above-mentioned non-depositional fluorine based compound is at least one compound selected from SF$_6$, NF$_3$, F$_2$, and CF$_4$. When dissociated by electric discharges, these compounds will emit F* efficiently reducing the S/F ratio of the etching system. Then, F* will naturally etch the WSi$_x$ layer to remove W in the form of a fluoride, thus contributing to higher etchrate. If F* is supplied in greater quantities, refractory metal fluorides will be formed to have a high vapor pressure and be removed from the sidewalls of the WSi$_x$ pattern with higher efficiency. Consequently, fluorides with a low vapor pressure will remain on the sidewalls of the WSi$_x$ pattern for a shorter period, so that WS$_x$ will be formed with lower frequency to attach to the sidewalls of the WSi$_x$ pattern in smaller quantities.

Since all the above-mentioned fluorine based compounds are non-depositional, there is no danger that they may form any other unnecessary depositional substance than sulfur in the gaseous phase.

Although SF$_6$ has a sulfur atom in each molecule thereof, it has been experimentally verified that it will form no free sulfur in a plasma.

Accordingly, during etching of the WSi$_x$ layer, virtually sulfur alone will serve to protect the sidewalls of the WSi$_x$ pattern, thus preventing tapering thereof due to excessive quantities of miscellaneous deposits on the sidewalls thereof.

While the above-mentioned problem with an etching process for the WSi$_x$ layer can be solved by inhibiting formation of WS$_x$ attaching in excessive quantities to the sidewalls of the WSi$_x$ pattern, it remains to be achieved in an etching process for a polycide film to anisotropically etch a polysilicon layer. According to the present invention, one countermeasure to this difficulty is to keep a target wafer at lower temperatures when etching a polysilicon layer than when etching a refractory metal silicide layer. This measure serves to inhibit the reactivity of F* and migration occurring on the surface of the wafer, making it possible to anisotropically etch the polysilicon layer even by using etching gas of the same composition as that for the refractory metal silicide layer. Needless to say, the anisotropy of the polysilicon layer is more likely to improve if the etching gas contains no non-depositional fluorine based compound.

Another countermeasure is to add such fluorine radical consuming compounds as H$_2$, H$_2$S, and silane based compounds to the etching gas for the polysilicon layer, thereby increasing the S/F ratio of the etching system.

Of these fluorine radical consuming compounds, H$_2$ and H$_2$S, when dissociated by electric discharges, will emit H*, which will capture excessive F* to form HF for removal from the etching system via the exhaust system of an etcher, thus increasing the S/F ratio of the etching system. Particularly, H$_2$S will serve to increase the S/F ratio more effectively by supplying sulfur for itself. A similar effect can also be achieved by silane based compounds, which, when dissociated by electric discharges, will emit Si* besides H*. Both these radicals will also capture excessive F* to form HF, SiF$_x$, etc. for removal from the etching system.

Such an increase in the S/F ratio means a relative increase in the quantity of sulfur being deposited on and protecting the sidewalls of a polysilicon pattern to promote anisotropic etching of a polycide film and a relative decrease in the quantity of F* to promote selectivity for an underlying layer composed of silicon oxide based materials, etc.

As is clear from the foregoing description, a dry etching method according to the present invention is most suitable for production of high-reliability, high-performance, large-scale integrated semiconductor devices conforming to strict design rules.

Further, it is to be noted that a dry etching method according to the present invention also has the advantage of using no CFC.

BRIEF DESCRIPTION OF THE DRAWINGS

FIG. 1a shows a stage where a resist mask is formed on a W polycide film. FIG. 1b shows a stage where a WSi$_x$ pattern is tapered during etching of a WSi$_x$ layer. FIG. 1c shows a stage where critical dimensional losses occur during etching of a polysilicon layer. FIG. 1d shows a stage where part of a sidewall protection film remains on the sidewalls of the gate pattern.

FIG. 2a shows a stage where a resist mask is formed on a W polycide film. FIG. 2b shows a stage where a WSi$_x$ alone is etched. FIG. 2c shows a stage where a polysilicon layer is etched. FIG. 2d shows a stage where a sidewall protection film is removed together with the resist mask.

DETAILED DESCRIPTION OF THE INVENTION

The following paragraphs describe some preferred Examples of the present invention.

EXAMPLE 1

In this Example, a dry etching method according to the present invention is applied to a W polycide gate electrode forming process wherein a W polycide film on a wafer kept at $-10°$ C. is etched by using S$_2$F$_2$ as an etching gas. This process is described by referring to FIGS. 2a, 2c, and 2d.

Figure 1A:
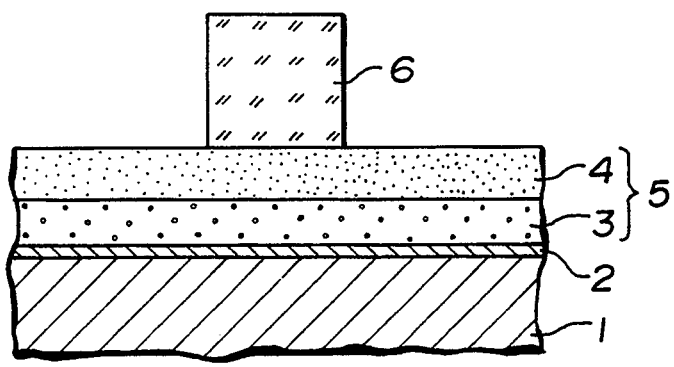
FIGS. 1a–1d are schematic sectional views showing the stages of a W polycide gate electrode forming process according to the prior art.
Figure 1B:
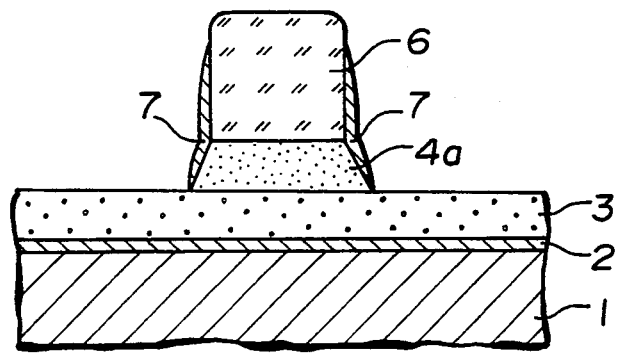
Figure 1C:
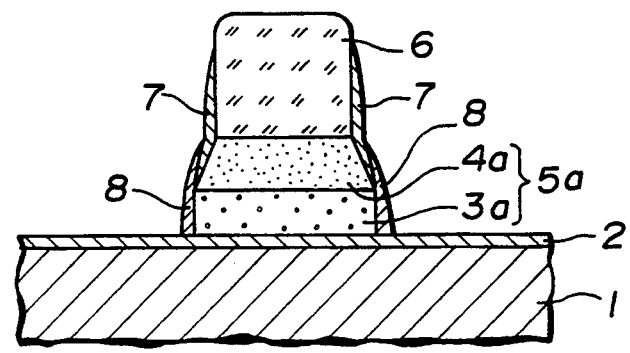
Figure 1D:
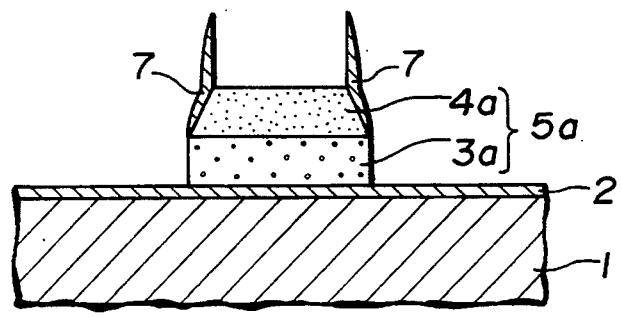
Figure 2A:
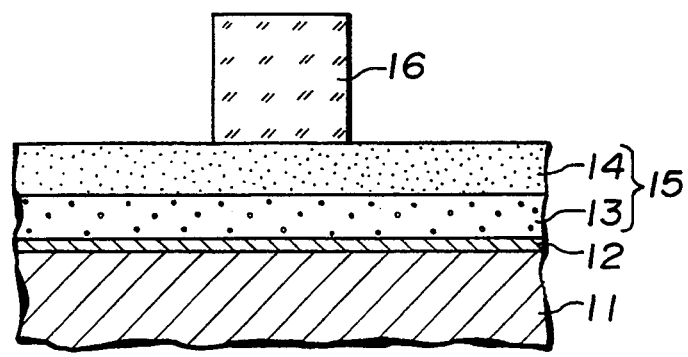
FIGS. 2a–2d are schematic sectional views showing the stages of a W polycide gate electrode forming process according to the present invention.

Referring first to FIG. 2a, a silicon substrate 11 is coated on an upper surface thereof with a gate oxide film 12 formed, for instance, through thermal oxidation. The gate oxide film 12 is provided on an upper surface thereof with a polysilicon layer 13 doped with n-type impurities and a WSi$_x$ layer 14, which are fabricated in this order to constitute a W polycide film 15. The W polycide film 15 is provided on an upper surface thereof with a resist mask 16 patterned into a predetermined shape.

The sample wafer thus formed was set on a wafer supporting electrode provided on an RF biased magnetically enhanced microwave plasma etcher and cooled by an ethanol refrigerant which was fed from a cooling system, for instance, a chiller for circulation through a cooling pipe housed in the wafer supporting electrode. In this state, the W polycide film 15 was etched, for instance, under the following conditions:

| | |
|---|---|
| S$_2$F$_2$ flow rate: | 5 SCCM |
| Gas pressure: | 1.3 Pa (10 mTorr) |
| Microwave power: | 850 W (2.45 GHz) |

| -continued | |
|---|---|
| RF bias power: | 30 W (2 MHz) |
| Wafer temperature: | −10° C. |

In the above-mentioned etching conditions, the W polycide film 15 was etched by F* emitted by $S_2F_2$ with the assistance of such ions as S+ and $SF_x{}^+$. The $WSi_x$ layer 14 was etched to form $WF_x$ and $SiF_x$ while the polysilicon layer 13 was etched to form $SiF_x$ alone.

Figure 2B:
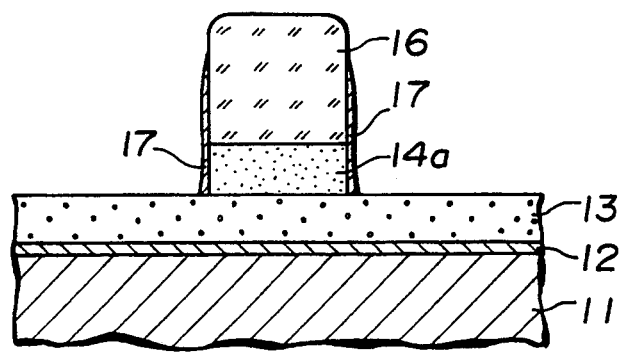
Figure 2C:
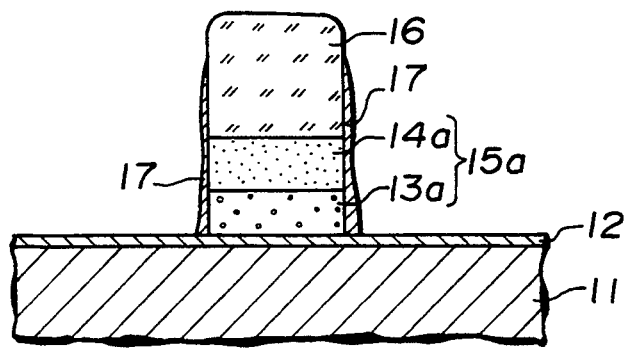

Referring next to FIG. 2c, when sulfur supplied by $S_2F_2$ formed sidewall protection films 17, the $WSi_x$ layer 14 and the polysilicon layer 13 formed a $WSi_x$ pattern 14a and a polysilicon pattern 13a respectively in such a manner as to have nearly vertical walls and form a W polycide gate electrode 15a into a highly anisotropic shape.

At this time, since the sidewall protection films 17 were not formed in excessive quantities, the $WSi_x$ pattern 14a was not tapered. Namely, since the wafer was cooled to higher temperatures than in conventional low-temperature etching, $WF_x$ resulting from etching of the $WSi_x$ layer 14 had a higher vapor pressure, became less likely to remain on the sidewalls of the $WSi_x$ pattern 14a, and volatilized for removal therefrom before reacting with sulfur to form $WS_x$.

In the drawings, the sidewall protection films 17 are represented for the sake of clarity as if they were thick films. Actually, however, the sidewall protection films 17 are too thin films to taper the $WSi_x$ pattern 14a. Further, since a low RF bias power was set under the above-mentioned etching conditions, the $WSi_x$ layer 14 and the polysilicon layer 13 were etched with high selectivity for the underlying gate oxide film 12.

Figure 2D:
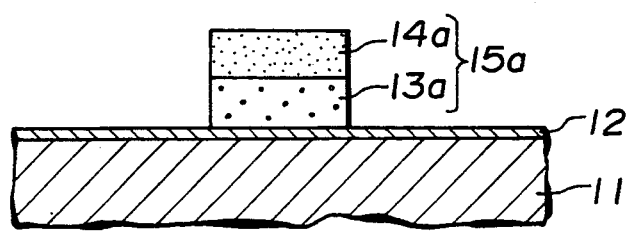

Referring finally to FIG. 2d, when the sample wafer was set on a plasma ashing apparatus to remove the resist mask 16 through ordinary $O_2$ plasma ashing, the sidewall protection films 17, composed mainly of sulfur, were removed immediately without causing any particle pollution as they burned in the form of $SO_x$ and sublimed under the influence of the reaction or plasma radiation heat. Consequently, the W polycide gate electrode 15a was formed into a highly anisotropic shape in a highly clean atmosphere.

EXAMPLE 2

In this Example, a dry etching method according to the present invention is applied to a W polycide gate electrode forming process wherein a $WSi_x$ layer is first etched under the same conditions as in Example 1 and a polysilicon layer is then etched with a wafer cooled to lower temperatures than in Example 1, thus improving both anisotropy and selectivity. This process is described by referring to FIGS. 2a, 2b, and 2c.

Referring first to FIG. 2a, a sample wafer was formed in the same manner as in Example 1. Referring next to FIG. 2b, when the sample wafer was set on a wafer supporting electrode on an RF biased magnetically enhanced microwave plasma etcher to etch the W polycide film 15 under the same conditions as in Example 1, the sidewall protection films 17 were formed mainly of sulfur while the $WSi_x$ layer 14 was etched to form the $WSi_x$ pattern 14a into a highly anisotropic non-tapered shape. The $WSi_x$ layer 14 was etched while monitoring the emission spectrum and the etching was stopped when the emission spectrum exceeded the peak intensity at 440 nm due to $SiF_x$.

Referring finally to FIG. 2c, when the polysilicon layer 13 was etched under the same conditions except that the sample wafer was further cooled to −50° C., the W polycide gate electrode 15a was formed into a highly anisotropic shape with a high selectivity of more than 20 for the underlying gate oxide film 12. Since the polysilicon layer 13 tends to be etched by F* at a higher rate than the $WSi_x$ layer 14, the polysilicon pattern is likely to have such etching defects as undercut during etching of the W polycide film 15. Such etching defects are conspicuous particularly during over-etching of the W polycide film 15, when an excessive quantity of F* relative to an etching area causes migration along the surface of the wafer and attacks the sidewalls of the polysilicon pattern 13a. To prevent these etching defects, therefore, the wafer was further cooled as mentioned above to decrease the reactivity of F* and promote the deposition of sulfur on the sidewalls of the polysilicon pattern 13a, thus improving anisotropy of the W polycide film 15 more easily and effectively.

Incidentally, the present assignee have proposed in Japanese Laid-Open Patent (Tokkaihei) 4-96224 (1992, unexamined) a multi-chamber etcher which is capable of carrying a target wafer under a high vacuum among multiple etching chambers with each chamber having a wafer supporting electrode kept at different temperatures from one another. Such an etcher is preferable in an etching process involving wafer temperature changes as in this Example, because it is more advantageous in improving process stability and throughput to change wafer temperatures in multiple chambers than in a single chamber.

EXAMPLE 3

In this Example, a dry etching method according to the present invention is applied to a W polycide gate electrode forming process wherein a $WSi_x$ layer is first etched under the same conditions as in Example 1 and a polysilicon layer is then etched by $H_2$ added to the etching gas, thus improving both anisotropy and selectivity.

In this Example, the $WSi_x$ layer 14 was first etched under the same conditions as in Example 1 and the polysilicon layer 13 was then etched, for instance, under the following conditions:

| | |
|---|---|
| $S_2F_2$ flow rate: | 5 SCCM |
| $H_2$ flow rate: | 5 SCCM |
| Gas pressure: | 1.3 Pa (10 mTorr) |
| Microwave power: | 850 W (2.45 GHz) |
| RF bias power: | 30 W (2 MHz) |
| Wafer temperature: | −10° C. |

In the above-mentioned etching conditions, $H_2$ added to the etching gas for the polysilicon layer 13 emitted H*, which captured excessive F*, thus increasing the apparent S/F ratio of the etching system. This increase in the S/F ratio means a relative decrease in the reactivity of F* and a relative increase in the quantity of the sulfur deposited on the sidewalls of the polysilicon pattern 13a, thus improving both anisotropy of the W polycide film 15 and selectivity for the underlying gate oxide film 12. Consequently, the W polycide gate electrode 15a was formed into a highly anisotropic shape in the same manner as in the foregoing Examples.

Incidentally, the etching process in this Example only involves changes in the composition of the etching gas for the W polycide film 15 and takes some time to stabilize electric discharges in the etching gas but accompanies no considerable throughput reduction or requires no multi-chamber etcher.

EXAMPLE 4

In this Example, a dry etching method according to the present invention is applied to a W polycide gate electrode forming process wherein a $WSi_x$ layer is first etched by using $S_2F_2/SF_6$ mixed gas and a polysilicon layer is then etched by using $S_2F_2$.

First, the $WSi_x$ layer 14 formed on the sample wafer shown in FIG. 2a was etched, for instance, under the following conditions:

| | |
|---|---|
| $S_2F_2$ flow rate: | 20 SCCM |
| $SF_6$ flow rate: | 10 SCCM |
| Gas pressure: | 1.3 Pa (10 mTorr) |
| Microwave power: | 850 W (2.45 GHz) |
| RF bias power: | 30 W (2 MHz) |
| Wafer temperature: | $-40°$ C. |

In the above-mentioned etching conditions, the $WSi_x$ layer 14 was etched at a high rate by F* emitted by $S_2F_2$ and emitted in great quantities by $SF_6$ with the assistance of such ions as $S^+$ and $SF_x^+$. Sulfur also deposited on and protected the sidewalls of the $WSi_x$ pattern 14a, but it was not supplied in excessive quantities because $SF_6$ served to decrease the S/F ratio of the etching system. Rather, sulfur was inhibited from depositing in excessive quantities on the sidewalls of the $WSi_x$ pattern 14a because the vapor pressure of $WF_x$ increased to promote elimination thereof from the sidewalls of the $WSi_x$ pattern 14a and thereby inhibit formation of $WS_x$. Further, since a low RF bias power was set under the above-mentioned etching conditions, there were few decomposition products resulting from sputtering of the resist mask 16. Consequently, the sidewall protection films 17 were not formed to such a great thickness as to cause critical dimension losses.

Then, the polysilicon layer 13 was etched under the same conditions as mentioned above except that $SF_6$ was excluded from the etching gas. Under these etching conditions, the polysilicon layer 13 was etched by F* emitted from $S_2F_2$ alone with a higher S/F ratio of the etching system than for the $WSi_x$ layer 14. This increase in the S/F ratio means a relative decrease in the reactivity of F* and a relative increase in the quantity of the sulfur deposited on the sidewalls of the polysilicon pattern 13a. Consequently, the polysilicon pattern 13a was formed in such a manner as to have nearly vertical walls.

EXAMPLE 5

In this Example, a dry etching method according to the present invention is applied to a W polycide gate electrode forming process wherein a $WSi_x$ layer is first etched by using $S_2F_2/SF_6$ mixed gas with a wafer cooled to $-40°$ C. and a polysilicon layer is then etched by using the same gas with the wafer further cooled to $-80°$ C.

First, the sample wafer shown in FIG. 2a was set on a wafer supporting electrode on an RF biased magnetically enhanced microwave plasma etcher to etch the $WSi_x$ layer 14 under the same conditions as in Example 1.

Then, the polysilicon layer 13 was etched under the same conditions as mentioned above except that the wafer was cooled further to $-80°$ C. Under these etching conditions, the wafer was thus further cooled to decrease the reactivity of F* and to promote the deposition of sulfur on the sidewalls of the polysilicon pattern 13a, thus improving anisotropy of the W polycide film 15 more easily and effectively. Further, since the etching gas constantly contained $SF_6$, the polysilicon layer 13 was etched at a high rate of about 400 nm/min.

EXAMPLE 6

In this Example, a dry etching method according to the present invention is applied to a W polycide gate electrode forming process wherein a $WSi_x$ layer is first etched by using $S_2F_2/SF_6$ mixed gas and a polysilicon layer is then etched by using $S_2F_2/H_2S$.

First step, the sample wafer shown in FIG. 2a was set on a wafer supporting electrode on an RF biased magnetically enhanced microwave plasma etcher to etch the $WSi_x$ layer 14 under the same conditions as in Example 1.

Then, the polysilicon layer 13 was etched, for instance, under the following conditions:

| | |
|---|---|
| $S_2F_2$ flow rate: | 20 SCCM |
| $H_2S$ flow rate: | 10 SCCM |
| Gas pressure: | 1.3 Pa (10 mTorr) |
| Microwave power: | 850 W (2.45 GHz) |
| RF bias power: | 30 W (2 MHz) |
| Wafer temperature: | $-40°$ C. |

In the above-mentioned etching conditions, $H_2S$ added to the etching gas for the polysilicon layer 13 emitted H*, which captured excessive F*, and also formed free sulfur, thus increasing the apparent S/F ratio of the etching system. This increase in the S/F ratio means a relative decrease in the reactivity of F* and a relative increase in the quantity of the sulfur deposited on the sidewalls of the polysilicon pattern 13a, thus improving both anisotropy of the W polycide film 15 and selectivity for the underlying gate oxide film 12. Consequently, the W polycide gate electrode 15a was formed into a highly anisotropic shape with a high selectivity of more than 20 for the underlying gate oxide film 12 without further cooling the wafer during etching of the polysilicon layer 13.

While the present invention has been described in six preferred Examples thereof, it is to be understood that the present invention is not limited to those Examples and that various changes and modifications may be made in the present invention without departing from the spirit and scope thereof.

For instance, a refractory metal silicide layer is a $WSi_x$ layer in the above-mentioned Examples but may be replaced by an $MoSi_x$ layer, $TiSi_x$ layer, $TaSi_x$ layer, etc.

Further, a polysilicon layer in the above-mentioned Examples is generally used as a silicon based material layer constituting the lower layer of a polycide film but may be replaced by an impurity-doped amorphous silicon layer with the almost same etching characteristics as the polysilicon layer as proposed by the present assignee in Japanese Laid-Open Patent(Tokkaisho) 63-163 (1988, unexamined). Namely, the amorphous silicon layer will transform into the polysilicon layer before finally functioning as an MOS-FET gate electrode and have the same constitution as the conventional polycide gate electrode. More particularly, amorphous silicon will transform into polysilicon in a heat treatment process for diffusing impurities doped in the source and drain regions.

Further, $S_2F_2$ is used as sulfur fluoride, $SF_6$ as a non-depositional fluorine based compound, and $H_2$ and $H_2S$ as a compound serving to increase the S/F ratio of the etching system in the above-mentioned Examples. Basically, the effects of these compounds may also be achieved by any other compound disclosed herein.

Still further, etching gas used in all the steps of a dry etching method according to the present invention may contain such rare gases as Ar and He for achieving sputtering, dilution, cooling, and other effects.

What is claimed is:

1. A dry etching method for etching a polycide film formed of at least a silicon based material layer and a refractory metal silicide layer which are fabricated in this order on a substrate, said method comprising plasma etching at least said refractory metal silicide layer to form sidewalls by using an etching gas containing at least one sulfur fluoride selected from a group consisting of $S_2F_2$, $SF_2$, $SF_4$, and $S_2F_{10}$; and inhibiting the formation of refractory metal sulfides on the metal silicide sidewalls while depositing sulfur on the silicon sidewalls.

2. A dry etching method as claimed in claim 1 wherein said substrate is a single-crystal silicon substrate coated on the surface thereof with a gate oxide film, said silicon based material layer is an impurity-doped polysilicon layer, and said refractory metal silicide layer is a tungsten silicide layer.

3. A dry etching method for etching a polycide film formed of at least a silicon based material layer and a refractory metal silicide layer which are fabricated in this order on a substrate, said method comprising:
   a first step of plasma etching said refractory metal silicide layer by using etching gas containing at least one sulfur fluoride selected from $S_2F_2$, $SF_2$, $SF_4$, and $S_2F_{10}$ with said substrate kept at temperatures between $-20°$ C. and room temperature to inhibit formation of refractory metal sulfides on the metal silicide sidewalls, and
   a second step of plasma etching said silicon based material layer with said substrate being kept at lower temperatures than in said first step to deposit sulfur on the silicon sidewalls that are being formed.

4. A dry etching method as claimed in claim 3 wherein said substrate is a single-crystal silicon substrate coated on the surface thereof with a gate oxide film, said silicon based material layer is an impurity-doped polysilicon layer, and said refractory metal silicide layer is a tungsten silicide layer.

5. A dry etching method for etching a polycide film formed of at least a silicon based material layer and a refractory metal silicide layer which are fabricated in this order on a substrate, said method comprising:
   a first step of plasma etching said refractory metal silicide layer to form sidewalls by using an etching gas containing at least one sulfur fluoride selected from $S_2F_2$, $SF_2$, $SF_4$, and $S_2F_{10}$ with said substrate kept at temperatures between $-20°$ C. and room temperature to inhibit formation of refractory metal sulfides on the metal silicide sidewalls, and
   a second step of plasma etching said silicon based material layer by using said etching gas further containing at least one fluorine radical consuming compound selected from $H_2$, $H_2S$, and silane based compounds to increase the ratio of S to F and to deposit sulfur on sidewalls of the silicon based material layer.

6. A dry etching method as claimed in claim 5 wherein said substrate is a single-crystal silicon substrate coated on the surface thereof with a gate oxide film, said silicon based material layer is an impurity-doped polysilicon layer, and said refractory metal silicide layer is a tungsten silicide layer.

7. A dry etching method for etching a polycide film formed of at least a silicon based material layer and a refractory metal silicide layer which are fabricated in this order on a substrate, said method comprising plasma etching at least said refractory metal silicide layer by using an etching gas containing a non-depositional fluorine based compound and at least one sulfur fluoride selected from the group consisting of $S_2F_2$, $SF_2$, $SF_4$, and $S_2F_{10}$ to inhibit the formation of refractory metal sulfides on the metal silicide while depositing sulfur on the silicon sidewalls.

8. A dry etching method as claimed in claim 7 wherein said non-depositional fluorine based compound is at least one compound selected from $SF_6$, $NF_3$, $F_2$, and $CF_4$.

9. A dry etching method as claimed in claim 7 wherein said substrate is a single-crystal silicon substrate coated on the surface thereof with a gate oxide film, said silicon based material layer is an impurity-doped polysilicon layer, and said refractory metal silicide layer is a tungsten silicide layer.

10. A dry etching method for etching a polycide film formed of at least a silicon based material layer and a refractory metal silicide layer which are fabricated in this order on a substrate, said method comprising:
    a first step of plasma etching said refractory metal silicide layer by using an etching gas containing a non-depositional fluorine based compound and at least one sulfur fluoride selected from $S_2F_2$, $SF_2$, $SF_4$, and $S_2F_{10}$ to inhibit the formation of refractory metal sulfides on the metal silicide sidewall, and
    a second step of plasma etching said silicon based material layer with said substrate being kept at lower temperatures than in said first step to deposit sulfur on sidewalls being formed in the silicon based material layer.

11. A dry etching method as claimed in claim 10 wherein said non-depositional fluorine based compound is at least one compound selected from $SF_6$, $NF_3$, $F_2$, and $CF_4$.

12. A dry etching method as claimed in claim 10 wherein said substrate is a single-crystal silicon substrate coated on the surface thereof with a gate oxide film, said silicon based material layer is an impurity-doped polysilicon layer, and said refractory metal silicide layer is a tungsten silicide layer.

13. A dry etching method for etching a polycide film formed of at least a silicon based material layer and a refractory metal silicide layer which are fabricated in this order on a substrate, said method comprising:
    a first step of plasma etching said refractory metal silicide layer by using an etching gas containing a non-depositional fluorine based compound and at least one sulfur fluoride selected from $S_2F_2$, $SF_2$, $SF_4$, and $S_2F_{10}$ to inhibit formation of refractory metal sulfides on the metal silicide sidewalls, and
    a second step of plasma etching said silicon based material layer by using an etching gas containing said sulfur fluoride and at least one fluorine radical consuming compound selected from $H_2$, $H_2S$, and silane based compounds to increase the S to F ratio and deposit sulfur on said silicon sidewalls being etched.

14. A dry etching method as claimed in claim 13 wherein said non-depositional fluorine based compound is at least one compound selected from $SF_6$, $NF_3$, $F_2$, and $CF_4$.

15. A dry etching method as claimed in claim 13 wherein said substrate is a single-crystal silicon substrate coated on the surface thereof with a gate oxide film, said silicon based material layer is an impurity-doped polysilicon layer, and said refractory metal silicide layer is a tungsten silicide layer.

* * * * *